US009092706B2

(12) United States Patent
Seo

(10) Patent No.: US 9,092,706 B2
(45) Date of Patent: Jul. 28, 2015

(54) ORGANIC LIGHT-EMITTING DEVICE FOR OUTPUTTING IMAGE AND SECURITY PATTERN, AND DISPLAY PANEL INCLUDING THE SAME

(71) Applicant: Samsung Display Co., Ltd., Yongin, Gyeonggi-Do (KR)

(72) Inventor: Hae-Kwan Seo, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/046,715

(22) Filed: Oct. 4, 2013

(65) Prior Publication Data

US 2014/0374494 A1 Dec. 25, 2014

(30) Foreign Application Priority Data

Jun. 25, 2013 (KR) ........................ 10-2013-0073307

(51) Int. Cl.

| | |
|---|---|
| ***G06K 19/02*** | (2006.01) |
| ***G06K 19/06*** | (2006.01) |
| ***G09G 3/32*** | (2006.01) |
| ***G07F 7/08*** | (2006.01) |
| ***H01L 51/50*** | (2006.01) |
| *H01L 51/52* | (2006.01) |
| *H01L 27/32* | (2006.01) |

(52) U.S. Cl.

CPC ........ *G06K 19/06046* (2013.01); *G07F 7/0846* (2013.01); *G09G 3/32* (2013.01); *H01L 27/3244* (2013.01); *H01L 51/504* (2013.01); *H01L 51/5012* (2013.01); *H01L 51/5044* (2013.01); *H01L 27/3213* (2013.01); *H01L 51/52* (2013.01)

(58) Field of Classification Search

CPC ............................ H01L 51/5036; C09K 11/06
USPC ......................................... 235/487, 488, 494
See application file for complete search history.

(56) References Cited

U.S. PATENT DOCUMENTS

| | | | | |
|---|---|---|---|---|
| 7,714,099 | B2 | 5/2010 | Morishita et al. | |
| 7,825,580 | B2 | 11/2010 | Hirosaki et al. | |
| 2007/0252512 | A1 | 11/2007 | Bertram et al. | |
| 2008/0230123 | A1 * | 9/2008 | Mitsui et al. | 136/263 |
| 2009/0309868 | A1 | 12/2009 | Jung et al. | |

(Continued)

FOREIGN PATENT DOCUMENTS

| | | | |
|---|---|---|---|
| CN | 102769025 | A | 11/2012 |
| CN | 102769105 | A | 11/2012 |

(Continued)

OTHER PUBLICATIONS

Etori et al., "Design of Multilayer Structure for UV Organic Light-Emitting Diodes Based on 2-(2-Naphtyl)-9,9'-spirobifluorene," *Japanese Journal of Applied Physics*, vol. 46, No. 8A, 2007, pp. 5071-5075.

(Continued)

*Primary Examiner* — Jamara Franklin

(74) *Attorney, Agent, or Firm* — Knobbe Martens Olson & Bear LLP

(57) ABSTRACT

In an aspect, an organic light-emitting device including a first electrode, a second electrode facing the first electrode, and an organic layer between the first electrode and the second electrode, wherein the organic layer includes a light-emitting layer which emits light in a visible spectrum and light in a non-visible spectrum is provided.

20 Claims, 2 Drawing Sheets

100
130
131 132 139
150
119
117
115
113
111
101
127 121 123 125 127
120

(56) References Cited

U.S. PATENT DOCUMENTS

| | | | |
|---|---|---|---|
| 2011/0127509 | A1 | 6/2011 | Joo et al. |
| 2013/0037785 | A1 | 2/2013 | Fujita et al. |
| 2013/0154141 | A1 | 6/2013 | Shioi et al. |
| 2014/0034911 | A1 | 2/2014 | Liu et al. |
| 2014/0034912 | A1 | 2/2014 | Liu et al. |

FOREIGN PATENT DOCUMENTS

| | | | |
|---|---|---|---|
| JP | 2005-120117 | A | 5/2005 |
| JP | 2009-286995 | A | 12/2009 |
| KR | 10-2007-0024036 | A | 3/2007 |
| KR | 10-2007-0042960 | A | 4/2007 |
| KR | 10-2007-0083268 | A | 8/2007 |
| KR | 10-2007-0118582 | A | 12/2007 |
| KR | 10-2008-0030568 | A | 4/2008 |
| KR | 10-2009-0128888 | A | 12/2009 |
| KR | 10-2011-0060494 | A | 6/2011 |

OTHER PUBLICATIONS

Sharma et al., “Polysilane based organic light emitting diodes: Simultaneous ultraviolet and visible emission,” *Journal of Applied Physics* 102, 084506 (2007) pp. 084506-1-084506-7.

Extended European Search Report dated Nov. 27, 2014 for European Patent Application No. EP 14 162 722.4 which shares priority of Korean Patent Application No. KR 10-2013-0073307 with captioned U.S. Appl. No. 14/046,715, and cites the above-identified references numbered 1-7.

* cited by examiner

ORGANIC LIGHT-EMITTING DEVICE FOR OUTPUTTING IMAGE AND SECURITY PATTERN, AND DISPLAY PANEL INCLUDING THE SAME

INCORPORATION BY REFERENCE TO RELATED APPLICATIONS

Any and all priority claims identified in the Application Data Sheet, or any correction thereto, are hereby incorporated by reference under 37 CFR 1.57. For example, this application claims the benefit of Korean Patent Application No. 10-2013-0073307 in the Korean Intellectual Property Office on Jun. 25, 2013, the disclosure of which is incorporated herein by reference in its entirety.

BACKGROUND

1. Field

This disclosure relates to an organic light-emitting display panel for outputting an image including a security signal, and an identification card including the display panel.

2. Description of the Related Technology

Electronic identifications, such as an electronic passport in which the appearance of a person is displayed as a digital image instead of a photograph by using an organic light-emitting display (OLED) panel have been developed. Counterfeiting or tampering with electronic identifications, such as an electronic passport, may be possible by changing an OLED panel in a manner similar counterfeiting or tampering with a typical identification card by changing a photo. Therefore, security techniques for preventing the counterfeiting or tampering with electronic identifications have been investigated.

SUMMARY

Some embodiments provide an organic light-emitting device that may prevent counterfeiting or tampering with a display panel.

Some embodiments provide a display panel that may prevent counterfeiting or tampering.

Some embodiments provide an electronic identification, including the display panel that may prevent counterfeiting or tampering.

According to an aspect of the present embodiments, there is provided an organic light-emitting device including: a first electrode; a second electrode facing the first electrode; and an organic layer between the first electrode and the second electrode, wherein the organic layer includes a light-emitting layer which emits light in a visible spectrum and light in a non-visible spectrum.

In some embodiments, the light-emitting layer may include a first material which emits light in the visible spectrum and light in the non-visible spectrum. In this case, the first material may include AlInGaN, InGaN, AIP, AlAs, GaP, InN, AlInGaP, or AlGaAs.

In some embodiments, the light-emitting layer may include a first light-emitting layer emitting light in the visible spectrum and a second light-emitting layer emitting light in the non-visible spectrum. In some embodiments, the second light-emitting layer may include a second material which emits light in an infrared region. For example, the second material may include tris(acetylacetonato)(1,10-phenanthroline)erbium, tris(acetylacetonato)(1,10-phenanthroline) neodymium, tris(acetylacetonato)(1,10-phenanthroline)holmium, GaAsP, InP, or GaAs. In some embodiments, the second light-emitting layer may include a third material which emits light in an ultraviolet region. For example, the third material may include N,N'-bis(3-methylphenyl)-N,N'-bis-(phenyl)-benzidine (TPD), N,N'-di(naphthalene-1-yl)-N, N'-diphenyl-benzidine (alpha-NPD), N,N'-bis(naphthalen-1-yl)-N,N'-bis(phenyl)benzidine (alpha-NPB), N,N'-di(naphthalen-2-yl)-N,N'-diphenyl-benzine (beta-NPB), 2,9-dimethyl-4,7-diphenyl-1,10-phenanthroline (BCP), AlGaN, or AlN.

In some embodiments, the second light-emitting layer may act as a hole transport layer or an electron transport layer.

In some embodiments, the organic layer may further include at least one of a hole injection layer, a hole transport layer, an electron transport layer, or an electron injection layer.

In some embodiments, the first electrode may be an anode and the second electrode may be a cathode, or the first electrode may be a cathode and the second electrode may be an anode.

According to another aspect of the present embodiments, there is provided a display panel including: a first substrate; a thin film transistor on the first substrate; an insulating layer on the thin film transistor; the organic light-emitting device disposed on the insulating layer and electrically connected to the thin film transistor; and a second substrate on the organic light-emitting device.

In some embodiments, at least one of the first substrate and the second substrate may be transparent.

In some embodiments, a digital image may be generated by light in the visible spectrum and a digital security pattern may be generated by light in the non-visible spectrum.

In some embodiments, the digital image and the digital security pattern may be generated with a time difference.

In some embodiments, the digital image may be formed of a plurality of time-sequential digital image frames, and the digital security pattern may be generated at least any one time between the plurality of digital image frames or at a predetermined time before or after beginning of the plurality of digital image frames.

In some embodiments, the digital security pattern may be formed of a plurality of digital security pattern frames, and the plurality of digital security pattern frames may be generated at regular intervals between the plurality of digital image frames. In this case, the plurality of digital security pattern frames of the digital security pattern may be the same or may be different.

In some embodiments, the digital security pattern may be generated only during an operation of detecting the digital security pattern without generation of the digital image.

In some embodiments, the digital security pattern may be a barcode or a quick response (QR) code.

In some embodiments, a plurality of the thin film transistors and the organic light-emitting devices may be arranged to generate a full color image.

Some embodiments provide a method of electronic identification with a display panel as disclosed and described herein including:

generating a digital image; and generating a digital security pattern, wherein the digital image is generated by the light in the visible spectrum and a digital security pattern is generated by the light in the non-visible spectrum. In some embodiments, the digital image and the digital security pattern are generated with a time difference. In some embodiments, the digital image is formed of a plurality of digital image frames that are time-sequential, and the digital security pattern is generated at at least any one time between the plurality of digital image frames or at a predetermined time before or after a beginning of the plurality of digital image frames. In some embodiments, the digital security pattern is formed of a plurality of digital security pattern frames, and the plurality of digital security pattern frames are generated at regular intervals between the plurality of digital image frames. In some embodiments, the plurality of digital security pattern frames of the digital security pattern are same. In some embodiments, the digital security pattern is generated only during an operation of detecting the digital security pattern without generation of the digital image. In some embodiments, the digital security pattern is a barcode or a quick response (QR) code. In some embodiments, a plurality of thin film transistors and organic light-emitting devices are arranged to generate a full color image.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION

Figure 1:
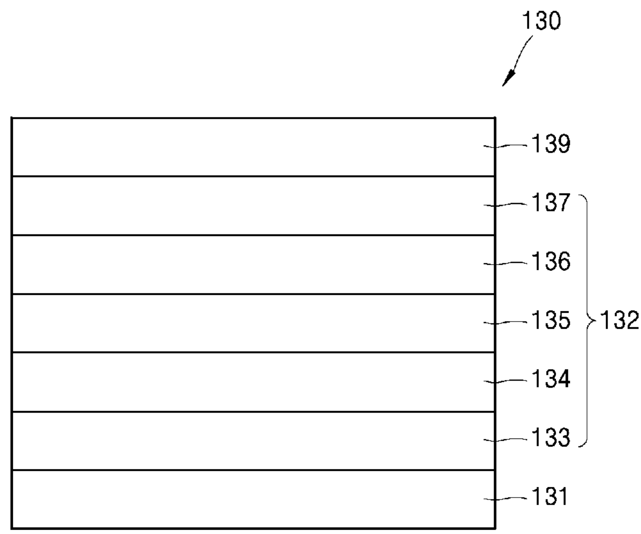
FIG. 1 is a schematic view illustrating an organic light-emitting device, according to an embodiment.

The present embodiments will now be described more fully with reference to the accompanying drawings, in which exemplary embodiments are shown. The invention may, however, be embodied in many different forms and should not be construed as being limited to the embodiments set forth herein. In the drawings, the thicknesses of layers and regions are exaggerated for clarity. Like reference numerals refer to like elements throughout.

FIG. 1 is a schematic view illustrating an organic light-emitting device, according to an embodiment.

In some embodiments, an organic light-emitting device 130 includes a first electrode 131, a second electrode 139 facing the first electrode 131, and an organic layer 132 disposed between the first electrode 131 and the second electrode 139 as shown in FIG. 1.

In some embodiments, the first electrode 131 may be an anode, and in this case, the first electrode 131 may be selected from high work function materials so as to facilitate hole injection. In some embodiments, the first electrode 131 may be a transmissive electrode or a reflective electrode. In some embodiments, the first electrode 131 may be formed of indium tin oxide (ITO), indium zinc oxide (IZO), zinc oxide (ZnO), Al-doped zinc oxide (AZO), indium oxide ($In_2O_3$), or tin oxide ($SnO_2$). Also, the first electrode 131 may be formed as a reflective electrode by using magnesium (Mg), silver (Ag), aluminum (Al), Al:lithium (Li), calcium (Ca), Ag:ITO, Mg:In, or Mg:Ag. The first electrode 131 may have a single-layer structure or a multilayer structure of two or more layers. For example, the first electrode 131 may have a three-layer structure of ITO/Ag/ITO. However, the first electrode 131 is not limited thereto.

In some embodiments, the organic layer 132 in the organic light-emitting device 130 may include at least an emissive layer (EML), and may further include layers for hole injection and transport, electron injection and transport, and charge balance, in addition to the EML.

In some embodiments, the organic layer 132 may include a hole injection layer (HIL) 133, a hole transport layer (HTL) 134, a light-emitting layer 135, an electron transport layer (ETL) 136, and an electron injection layer (EIL) 137.

In some embodiments, the HIL 133 may use a phthalocyanine compound, such as copper phthalocyanine, N,N'-diphenyl-N,N'-bis-[4-(phenyl-m-tolyl-amino)-phenyl]-biphenyl-4,4'-diamine (DNTPD), 4,4',4"-tris-(3-methylphenylphenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2T-NATA), poly(3,4-ethylenedioxythiophene)/poly(4-styrenesulfonate) (PEDOT/PSS), polyaniline/dodecylbenzenesulfonic acid (Pani/DBSA), polyaniline/camphorsulfonic acid (PANI/CSA), or polyaniline/poly(4-styrenesulfonate) (PANI/PSS). However, the present embodiments are not limited thereto.

In some embodiments, the HTL 134 may use carbazole derivatives, such as N-phenylcarbazole and polyvinylcarbazole, triphenylamine-based materials, such as N,N'-bis(3-methylphenyl)-N,N'-diphenyl-[1,1-biphenyl]-4,4'-diamine (TPD), N,N'-di(1-naphthyl)-N,N'-diphenylbenzidine (NPB), or 4,4',4"-tris(N-carbazolyl)triphenylamine (TCTA). However, the present embodiments are not limited thereto.

In some embodiments, the light-emitting layer 135 may include a material that may simultaneously emit light in a visible spectrum and light in a non-visible spectrum. For example, the light-emitting layer 135 may include a material that may emit light in an infrared or ultraviolet region of the non-visible spectrum as well as light in the visible spectrum, such as red, green, blue, white, purple, or orange light. In some embodiments, the light-emitting layer 135 may include a material, such as AlInGaN, InGaN, AIP, AlAs, GaP, InN, AlInGaP, and AlGaAs.

In some embodiments, the light-emitting layer 135 may emit both of the light in the visible spectrum and the light in the non-visible spectrum. For example, the light in the visible spectrum may be used to generate a digital image, and the light in the non-visible spectrum may be used to generate a digital security pattern. In some embodiments, the digital security pattern may be used to determine the presence of counterfeiting or tampering since the digital security pattern may be detected by a detection device. In some embodiments, the digital security pattern may be a barcode or a quick response (QR) code. However, the digital security pattern is not limited thereto.

In some embodiments, the ETL 136 may use a known material, such as tris(8-quinolinolate)aluminum ($Alq_3$), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate ($Bebq_2$), and 9,10-di(naphthalene-2-yl)anthrascene (ADN). However, the present embodiments are not limited thereto.

In some embodiments, the EIL 137 may use, for example, any material known as a material of an electron injection layer, such as LiF, NaCl, CsF, $Li_2O$, and BaO. However, the present embodiments are not limited thereto.

In some embodiments, the second electrode 139 may be a cathode, and in this case, a low work function metal, an alloy, an electrically conductive compound, or a mixture of two or more thereof may be used as the second electrode 139. For example, the second electrode 139 may be included as a transparent electrode or a reflective electrode. In a case where the second electrode 139 is included as the transparent electrode, the second electrode 139 may include a thin film formed of Li, Ca, Al, Mg, Mg—In, Mg—Ag, LiF—Al, LiF—Ca, or a compound thereof, and an auxiliary electrode formed of a transparent conductive material, such as ITO, IZO, ZnO, or $In_2O_3$, that is disposed on the thin film. In contrast, in a case where the second electrode 139 is included as the reflective electrode, the second electrode 139, for example, may be formed of Li, Ca, Al, Mg, Mg—In, Mg—Ag, LiF—Al, LiF—Ca, or a compound thereof.

Figure 2:
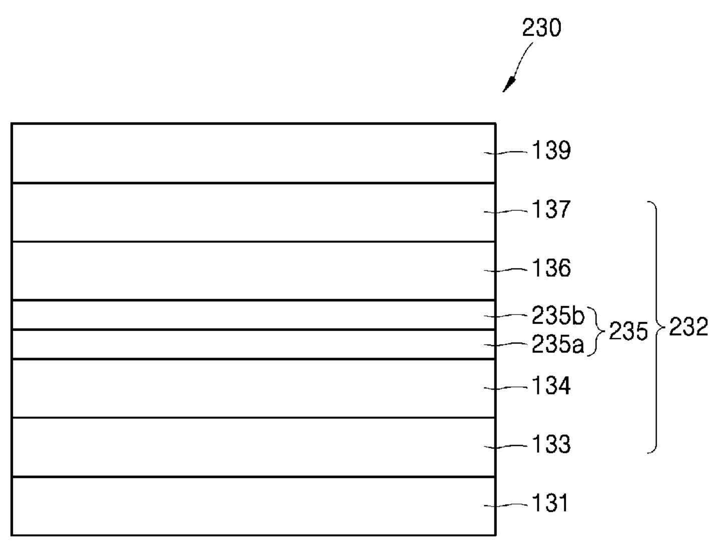
FIG. 2 is a schematic view illustrating an organic light-emitting device, according to another embodiment.

FIG. 2 is a schematic view illustrating an organic light-emitting device, according to another embodiment.

In some embodiments, an organic light-emitting device 230 may include a first electrode 131, a second electrode 139 facing the first electrode 131, and an organic layer 232 disposed between the first electrode 131 and the second electrode 139 as shown in FIG. 1. In some embodiments, the organic layer 232 includes an HIL 133, an HTL 134, a light-emitting layer 235, an ETL 136, and an EIL 137.

In some embodiments, the organic light-emitting device 230 may be different from the organic light-emitting device 130 in that the light-emitting layer 235 is composed of a first light-emitting layer 235*a* emitting light in the visible spectrum and a second light-emitting layer 235*b* emitting light in the non-visible spectrum. Although the second light-emitting layer 235*b* is disposed on the first light-emitting layer 235*a* in FIG. 2, the sequence of disposing the first light-emitting layer 235*a* and the second light-emitting layer 235*b* may be reversed. In some embodiments, another layer may be disposed between the first light-emitting layer 235*a* and the second light-emitting layer 235*b*. For example, in a case where one of the first light-emitting layer 235*a* and the second light-emitting layer 235*b* is a layer formed of an inorganic material, the other is a layer formed of an organic material, the layer formed of the organic material is first formed, and the layer formed of the inorganic material is formed later, a buffer layer (not shown) for protecting the layer formed of the organic material during the formation of the layer formed of the inorganic material may be further included between the first light-emitting layer 235*a* and the second light-emitting layer 235*b*.

In some embodiments, the first light-emitting layer 235*a* may use a known single light-emitting material or known host and dopant materials as a material emitting light in the visible spectrum In some embodiments, one or more known materials may be included as materials for emitting light having a red, green, or blue wavelength where the host and the dopant materials are used.

In some embodiments, the host of the first light-emitting layer 235*a* may use Alq3, 4,4'-bis(N-cabazolyl-1,1'-biphenyl (CBP), poly(n-vinylcabazole) (PVK), ADN, 4,4',4"-tris(carbazol-9-yl)-triphenylamine (TCTA), 1,3,5-tris(N-phenyl-benzimidazole-2-yl)benzene (TPBI), 3-tert-butyl-9,10-di (naphth-2-yl)anthracene (TBADN), distyrylarylene (DSA), 2,7-bis(9,9-diethylfluoren-2-yl)-9,9-diethylfluorene (E3), or 4,4'-bis(9-carbazolyl)-2,2'-dimethyl-biphenyl (CDBP). However, the present embodiments are not limited thereto.

In some embodiments, the dopant of the first light-emitting layer 235*a* may use at least one of a known fluorescent dopant or phosphorescent dopant. In some embodiments, the phosphorescent dopant may be iridium (Ir), platinum (Pt), osmium (Os), rhenium (Re), titanium (Ti), zirconium (Zr), hafnium (Hf), or an organic metal complex including a combination of two or more thereof. However, the present embodiments are not limited thereto.

In some embodiments, a known red dopant may be used such as Pt(II) octaethylporphine (PtOEP), tris(2-phenylisoquinoline)iridium ($Ir(piq)_3$), or bis(2-(2'-benzothienyl)-pyridinato-N,C3')iridium(acetylacetonate) (Btp2Ir(acac)). However, the present embodiments are not limited thereto.

In some embodiments, a known green dopant may be used such as Tris(2-phenylpyridine)iridium ($Ir(ppy)_3$), bis(2-phenylpyridine)(acetylacetonato)iridium(III) ($Ir(ppy)_2(acac)$), tris(2-(4-tolyl)phenylpyridine)iridium ($Ir(mppy)_3$), or 10-(2-benzothiazolyl)-1,1,7,7-tetramethyl-2,3,6,7-tetrahydro-1H, 5H,11H-[1]benzopyrano[6,7,8-ij]-quinolizin-11-one (C545T). However, the present embodiments are not limited thereto.

In some embodiments, a known blue dopant may be used such as Bis[3,5-difluoro-2-(2-pyridyl)phenyl](picolinato)iridium(III) ($F_2Irpic$), $(F_2ppy)_2Ir(tmd)$, $Ir(dfppz)_3$, 4,4'-bis(2,2'-diphenylethen-1-yl)biphenyl (DPVBi), 4,4'-bis[4-(diphenylamino)styryl]biphenyl (DPAVBi), or 2,5,8,11-tetra-tert-butyl perylene (TBPe). However, the present embodiments are not limited thereto.

In some embodiments, light in the non-visible spectrum of the second light-emitting layer 235*b* may include light in the infrared region or light in the ultraviolet region. In some embodiments, a material for emitting the light in the infrared region may include tris(acetylacetonato)(1,10-phenanthroline)erbium, tris(acetylacetonato)(1,10-phenanthroline) neodymium, tris(acetylacetonato)(1,10-phenanthroline)holmium, GaAsP, InP, GaAs, AlGaN, or AlN.

In some embodiments, a material for emitting the light in the ultraviolet region may include N,N'-bis(3-methylphenyl)-N,N'-bis-(phenyl)-benzidine (TPD), N,N'-di(naphthalene-1-yl)-N,N'-diphenyl-benzidine (alpha-NPD), N,N'-bis(naphthalen-1-yl)-N,N'-bis(phenyl)benzidine (alpha-NPB), N,N'-di(naphthalen-2-yl)-N,N'-diphenyl-benzine (beta-NPB), 2,9-dimethyl-4,7-diphenyl-1,10-phenanthroline (BCP), AlGaN, or AlN.

In some embodiments, the second light-emitting layer 235*b* may not only selectively act as a light-emitting layer of the light in the non-visible spectrum, but may also act as an HTL or an ETL. In some embodiments, the second light-emitting layer 235*b* including tris(acetylacetonato)(1,10-phenanthroline)erbium, tris(acetylacetonato) (1,10-phenanthroline)neodymium, or tris(acetylacetonato)(1,10-phenanthroline)holmium may simultaneously act as an ETL.

In some embodiments, the light in the visible spectrum emitted from the first light-emitting layer 235*a* may generate a digital image, and the light in the non-visible spectrum emitted from the second light-emitting layer 235*b* may generate a digital security pattern. In some embodiments, the digital security pattern may be used to determine the presence of counterfeiting or tampering since the digital security pattern may be detected by a detection device. In some embodiments, the digital security pattern may be a barcode or a QR code. However, the digital security pattern is not limited thereto.

Figure 3:
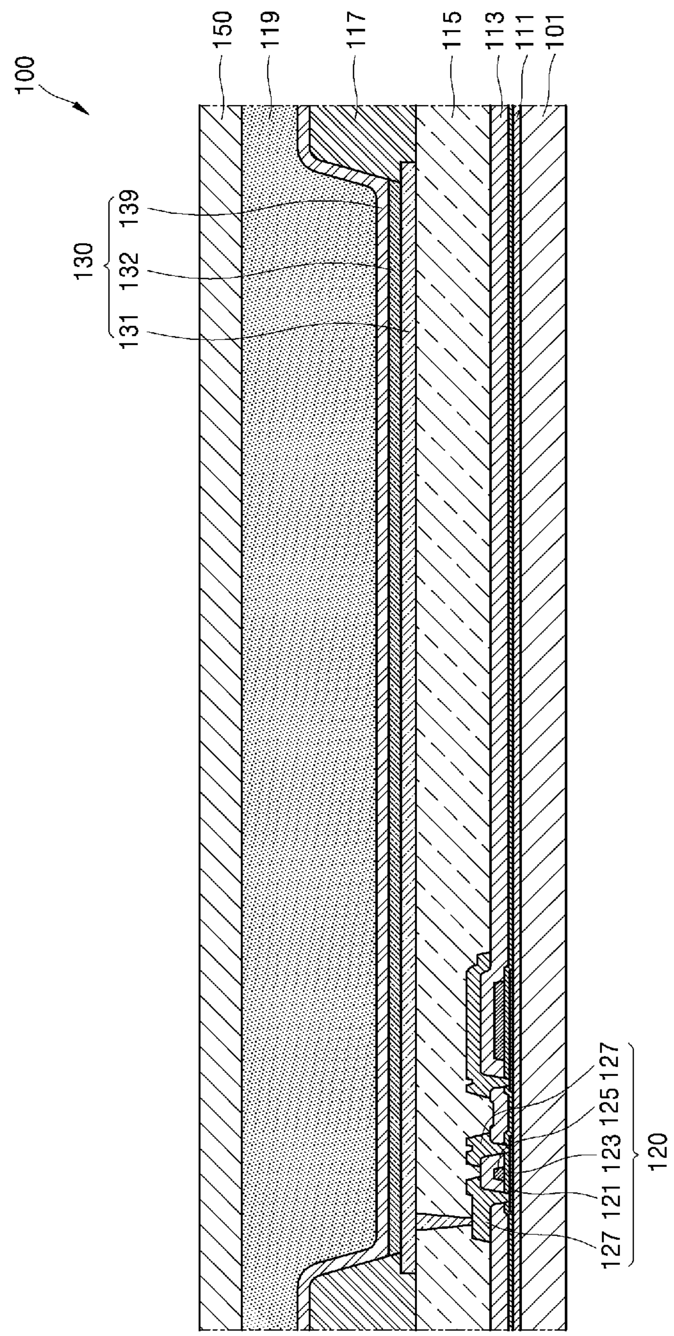
FIG. 3 is a cross-sectional view schematically illustrating a sub-pixel of a display panel, according to an embodiment.

FIG. 3 is a cross-sectional view schematically illustrating a sub-pixel of a display panel, according to an embodiment. In some embodiments, a pixel unit of the display panel may include a plurality of pixels each formed of red, green, and blue sub-pixels. In some embodiments, the sub-pixels include the above-described organic light-emitting device, and thus, may further emit light in the non-visible spectrum in addition to red, green, and blue light. In some embodiments, the colors of emitted light are not limited to red, green, and blue, and may further include white, purple, or orange.

It is described above that the light emission in the visible spectrum and the light emission in the non-visible spectrum are performed in the same layer or in different layers in a stack structure. However, a sub-pixel selectively emitting light in the visible spectrum and a sub-pixel selectively emitting light in the non-visible spectrum may be separately present in the device. For example, a sub-pixel formed of an organic material that emits light in the visible spectrum and a sub-pixel formed of an inorganic material light that emits light in the non-visible spectrum may both be present in the device.

Referring to FIG. 3, a pixel unit 100 of the display panel of the present invention includes a lower substrate 101, an upper substrate 150, a thin film transistor (TFT) 120 between the lower substrate 101 and the upper substrate 150, an organic light-emitting device 130 electrically connected to the TFT 120.

In some embodiments, the lower substrate 101 may use a substrate formed of various materials, such as glass, plastic, silicon, or metal. In a case where the digital image is generated through the lower substrate 101, a transparent glass substrate or plastic substrate may be used as the lower substrate 101. In this case, infrared or ultraviolet light may also transmit through the lower substrate 101.

In some embodiments, a buffer layer 111 for preventing the diffusion of impurity atoms or ions from the lower substrate 101 into the TFT or an organic layer disposed thereon, for preventing the penetration of moisture, and for planarizing a surface of the lower substrate 101 may be formed on the surface of the lower substrate 101. In some embodiments, a buffer layer 111 may be formed on the surface of the lower substrate 101. In some embodiments, a buffer layer 111 may prevent the diffusion of impurity atoms or ions from the lower substrate 101 into the TFT. In some embodiments, a buffer layer 111 may prevent the penetration of moisture into the TFT. In some embodiments, a buffer layer 111 may planarize a surface of the lower substrate 101. In some embodiments, the buffer layer 111 may be formed of an inorganic material, such as silicon oxide, silicon nitride, silicon oxynitride, aluminum oxide, aluminum nitride, titanium oxide, and titanium nitride, an organic material, such as polyimide, polyester, and acryl, or a stack thereof. In some embodiments, the buffer layer 111 may be omitted if necessary.

In some embodiments, the TFT 120 as a driving circuit may be formed on the buffer layer 111. In some embodiments, the TFT 120 includes an active layer 121, a gate dielectric layer 123, a gate electrode 125, and source and drain electrodes 127.

In some embodiments, the active layer 121 on the buffer layer 111 may be formed of an inorganic semiconductor material, such as amorphous silicon, polysilicon, and an oxide semiconductor, or an organic semiconductor material. For example, the oxide semiconductor may include an oxide of a material selected from the group consisting of Group 12, 13, and 14 metal elements, such as Zn, In, gallium (Ga), Sn, cadmium (Cd), germanium (Ge), and Hf, and a combination thereof. For example, the semiconductor active layer 121 may include $[(In_2O_3)_a(Ga_2O_3)_b(ZnO)_c]$ (GIZO) (where $a \geq 0$, $b \geq 0$, and $c \geq 0$). In some embodiments, the active layer 121 may have a source region, a drain region, and a channel region therebetween.

In some embodiments, the gate electrode 125 may be included on the gate dielectric layer 123 and an interlayer dielectric 113 may be formed to cover the gate electrode 125. In some embodiments, the source and drain electrodes 127 may be formed on the interlayer dielectric 113, and the source and drain electrodes 127 are connected to the source and drain regions of the active layer 121 through the interlayer dielectric 113.

Although a top-gate type TFT is illustrated in the present embodiment, a bottom-gate type TFT may be included. That is, the present embodiments are not necessarily limited to the stack structure of the TFT as described above, and TFTs having various structures may be used.

In some embodiments, a first planarization layer 115 may be formed on the source and drain electrodes 127. In some embodiments, the organic light-emitting device 130 or 230 as described above may be formed on the first planarization layer 115. In some embodiments, a first electrode 131 of the organic light-emitting device 130 or 230 may be formed on the first planarization layer 115, and the first electrode 131 is connected to the source and drain electrodes 127 through the first planarization layer 115. In some embodiments, each organic light-emitting device 130 or 230 may be separated by a pixel-defining layer 117. In some embodiments, a second planarization layer 119 may be formed on the organic light-emitting device 130 or 230. In some embodiments, the first planarization layer 115, the pixel-defining layer 117, and the second planarization layer 119 may be formed in a single or multilayer structure of an insulating inorganic material, organic material, or organic/inorganic composite.

In some embodiments, the upper substrate 150 may be formed on the second planarization layer 119. As described regarding the lower substrate 101, a substrate formed of various materials, such as glass, plastic, silicon, or metal, may be used as the upper substrate 150. In some embodiments, the upper substrate 150 may be formed in a thin film encapsulation structure which prevents the penetration of outside air and moisture into the organic light-emitting device 130 thereunder and is formed by stacking one or more insulating organic and inorganic layers. In a case where the digital image is generated through the upper substrate 150, the upper substrate 150 may be formed to be transparent by using a glass substrate or a plastic substrate. In this case, light in the non-visible spectrum, such as infrared or ultraviolet light, may also transmit through the upper substrate 150.

In some embodiments, the display panel may generate a specific digital security pattern as a security signal before and after the digital image or between the digital images. Also, separate from the generation of the digital image, the digital security pattern may be generated only during an operation for the detection of the counterfeiting or tampering. Since human eyes can only see light in the visible spectrum, the digital security pattern in the non-visible spectrum may not be visually identified.

In some embodiments, the digital image and the digital security pattern may be generated with a time difference. In some embodiments, the digital image may be formed of a plurality of sequential digital image frames, and the digital security pattern may be generated at at least any one time between the plurality of sequential digital image frames or may be generated at a predetermined time before or after the beginning of the plurality of sequential digital image frames. In some embodiments, the digital security pattern may be formed of a plurality of digital security pattern frames. In some embodiments, the plurality of digital security pattern frames may be generated at regular intervals between the plurality of digital image frames. In this case, the plurality of digital security pattern frames may be the same or may be different from one another. That is, the digital security pattern may exist in a single frame, may dynamically exist in many frames, and may periodically exist between the digital image frames.

In some embodiments, the security signal pattern may exhibit a unique value that is predetermined in the panel. In some embodiments, the digital security pattern may be a barcode or a QR code. However, the digital security pattern is not limited thereto. The presence of counterfeiting or tampering with the display panel may be easily identified by the detection of the digital security pattern by using a detector.

In some embodiments, the display panel may be used in various security documents, which include images and require the identification of the presence of counterfeiting or tampering with the images, as well as electronic passports or identifications.

In some embodiments, the organic light-emitting device may be an active matrix-type organic light-emitting display panel. In some embodiments, the organic light-emitting device may also be used in any apparatus as long as it is a display apparatus including a pixel-defining layer, such as a passive matrix-type organic light-emitting display panel.

In some embodiments, the light in a visible spectrum may be used to generate a digital image and the light in a non-visible spectrum may be used to generate a digital security pattern since a light-emitting layer of an organic light-emitting device constituting a display panel emits light in a non-visible spectrum as well as light in a visible spectrum. Thus, counterfeiting or tampering with the digital image may be identified by the detection of the digital security pattern.

While the embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An organic light-emitting device comprising:

a first electrode;

a second electrode facing the first electrode; and an organic layer between the first electrode and the second electrode, wherein the organic layer comprises a light-emitting layer which emits light in a visible spectrum and light in a non-visible spectrum.

2. The organic light-emitting device of claim 1, wherein the light-emitting layer comprises a first material which emits the light in the visible spectrum and the light in the non-visible spectrum.

3. The organic light-emitting device of claim 1, wherein the first material comprises AlInGaN, InGaN, AIP, AlAs, GaP, InN, AlInGaP, or AlGaAs.

4. The organic light-emitting device of claim 1, wherein the light-emitting layer comprises a first light-emitting layer emitting the light in the visible spectrum and a second light-emitting layer emitting the light in the non-visible spectrum.

5. The organic light-emitting device of claim 4, wherein the second light-emitting layer comprises a second material which emits light in an infrared region of the non-visible spectrum.

6. The organic light-emitting device of claim 5, wherein the second material comprises tris(acetylacetonato)(1,10-phenanthroline)erbium, tris(acetylacetonato)(1,10-phenanthroline)neodymium, tris(acetylacetonato)(1,10-phenanthroline)holmium, GaAsP, InP, or GaAs.

7. The organic light-emitting device of claim 4, wherein the second light-emitting layer comprises a third material which emits light in an ultraviolet region of the non-visible spectrum.

8. The organic light-emitting device of claim 7, wherein the third material comprises N,N'-bis(3-methylphenyl)-N,N'-bis-(phenyl)-benzidine (TPD), N,N'-di(naphthalene-1-yl)-N,N'-diphenyl-benzidine (alpha-NPD), N,N'-bis(naphthalen-1-yl)-N,N'-bis(phenyl)benzidine (alpha-NPB), N,N'-di(naphthalen-2-yl)-N,N'-diphenyl-benzine (beta-NPB), 2,9-dimethyl-4,7-diphenyl-1,10-phenanthroline (BCP), AlGaN, or AlN.

9. The organic light-emitting device of claim 4, wherein the second light-emitting layer also acts as a hole transport layer or an electron transport layer.

10. The organic light-emitting device of claim 1, wherein the organic layer further comprises at least one of a hole injection layer, a hole transport layer, an electron transport layer, or an electron injection layer.

11. A display panel comprising:

a first substrate;

a thin film transistor on the first substrate;

an insulating layer on the thin film transistor;

an organic light-emitting device disposed on the insulating layer and electrically connected to the thin film transistor; and a second substrate on the organic light-emitting device, wherein the organic light-emitting device comprises:

a first electrode;

a second electrode facing the first electrode; and an organic layer between the first electrode and the second electrode, wherein the organic layer comprises a light-emitting layer which emits light in a visible spectrum and light in a non-visible spectrum.

12. The display panel of claim 11, wherein at least one of the first substrate and the second substrate is transparent.

13. A method of electronic identification comprising:

generating a digital image with a display panel; and generating a digital security pattern with the display panel, wherein the digital image is generated by the light in the visible spectrum and a digital security pattern is generated by the light in the non-visible spectrum, wherein the display panel comprises:

a first substrate;

a thin film transistor on the first substrate;

an insulating layer on the thin film transistor;

an organic light-emitting device disposed on the insulating layer and electrically connected to the thin film transistor; and a second substrate on the organic light-emitting device, wherein the organic light-emitting device comprises:

a first electrode;

a second electrode facing the first electrode; and an organic layer between the first electrode and the second electrode, wherein the organic layer comprises a light-emitting layer which emits light in a visible spectrum and light in a non-visible spectrum.

14. The method of claim 13, wherein the digital image and the digital security pattern are generated with a time difference.

15. The method of claim 13, wherein the digital image is formed of a plurality of digital image frames that are time-sequential, and the digital security pattern is generated at at least any one time between the plurality of digital image frames or at a predetermined time before or after a beginning of the plurality of digital image frames.

16. The method of claim 15, wherein the digital security pattern is formed of a plurality of digital security pattern frames, and the plurality of digital security pattern frames are generated at regular intervals between the plurality of digital image frames.

17. The method of claim 16, wherein the plurality of digital security pattern frames of the digital security pattern are same.

18. The method of claim 13, wherein the digital security pattern is generated only during an operation of detecting the digital security pattern without generation of the digital image.

19. The method of claim 13, wherein the digital security pattern is a barcode or a quick response (QR) code.

20. The method of claim 13, wherein a plurality of thin film transistors and organic light-emitting devices are arranged to generate a full color image.

* * * * *